United States Patent [19]

Nishizawa et al.

[11] Patent Number: 5,527,733
[45] Date of Patent: Jun. 18, 1996

[54] IMPURITY DOPING METHOD WITH ADSORBED DIFFUSION SOURCE

[75] Inventors: Junichi Nishizawa, Miyagi; Kenji Aoki, Tokyo, both of Japan

[73] Assignee: Seiko Instruments Inc., Tokyo, Japan

[21] Appl. No.: 198,379

[22] Filed: Feb. 18, 1994

Related U.S. Application Data

[63] Continuation of Ser. No. 928,525, Aug. 11, 1992, abandoned, which is a continuation of Ser. No. 558,427, Jul. 27, 1990, abandoned.

[51] Int. Cl.$^6$ .................................................. H01L 21/225
[52] U.S. Cl. ........................... 437/160; 437/939; 437/950
[58] Field of Search ........................................ 437/165, 166, 437/160, 937, 939, 942, 946, 950; 148/DIG. 17, DIG. 34, DIG. 38, DIG. 144

[56] References Cited

U.S. PATENT DOCUMENTS

| | | | |
|---|---|---|---|
| 3,247,032 | 4/1966 | Griswold | 437/164 |
| 3,506,508 | 4/1970 | Nickl | 437/225 |
| 4,151,008 | 4/1979 | Kirkpatrick | 437/942 |
| 4,242,691 | 12/1980 | Kotani et al. | 257/327 |
| 4,395,433 | 7/1983 | Nagakubo et al. | 437/19 |
| 4,441,932 | 4/1984 | Akasaka et al. | 437/31 |
| 4,465,529 | 8/1984 | Arima et al. | 437/165 |
| 4,737,471 | 4/1988 | Shirato et al. | 437/953 |
| 4,791,074 | 12/1988 | Tsunashima et al. | 437/160 |
| 4,855,258 | 8/1989 | Allman et al. | 437/939 |
| 4,861,729 | 8/1989 | Fuse et al. | 437/165 |
| 4,940,505 | 7/1990 | Schachameyer et al. | 437/946 |
| 4,951,601 | 8/1990 | Maydan et al. | 118/719 |

FOREIGN PATENT DOCUMENTS

| | | |
|---|---|---|
| 0322921 | of 0000 | European Pat. Off. . |
| 0259777 | of 0000 | European Pat. Off. . |
| 316165A3 | 5/1989 | European Pat. Off. . |
| 0413982 | 2/1991 | European Pat. Off. . |
| 62-271475 | 11/1987 | Japan . |
| 63-39939 | 10/1988 | Japan . |
| 1192159 | 8/1989 | Japan . |
| 1384206 | 6/1987 | United Kingdom . |
| 8201380 | 10/1981 | WIPO . |

OTHER PUBLICATIONS

Wolf, "Silicon Processing for the VLSI Era, vol. 1: Process Technology", 1986, pp. 133–136, 264–265.
"Ultrashallow, High Doping of Boron using Molecular Layer Doping", by Nishizawa; Applied Physics Letters; 56 (1990) 2 Apr., No. 14.
"Metal–oxide–Silicon Field–Effect Transistor Made by Means of Solid–Phase Doping", by Gong et al.; J. Appl. Phys. 65 (11), 1 Jun. 1989.
Nishizawam, Jun–ichi, "Simple–Structured PMOSFET Fabricated using Molecular Layer Doping", 8179 IEEE Electron Device Letters, Mar. 11, 1990, pp. 105–106.
Leung, D. L., et al., "CMOS Devices Fabricated in Thin Epitaxial Silicon On Oxide", 1989, IEEE SOS/SOI Technology Conference, Oct., 1989, pp. 74–75.
English Translation of Ito–63–166220 (Japan).
Wolf, et al., "Silicon Processing for the VLSI Era", p. 198, 1986.
Gorkum et al., "Controlled Atomic Layer Doping and ALD MOSFET Fabrication in Si", Jpn. Jnl. of Appl. Phys. vol. 26, No. 12, pp. L1933–L1936, Dec. 1987.
S. K. Ghandhi, VLSI Fabrication Principles, pp. 214–216, 1983.
"UV epitaxy applied to make transistor", Nikkei High Tech Report, vol. 4, No. 4, 13 Feb. 1989, p. 10.
Excerpt from Patent Abstracts of Japan, vol. 12, No. 430, Japanese patent No. 63–166220 Jul. 9, 1988.
"Doping reaction fo PH3 and B2H6 with Si(100)", Journal of Applied Physics, vol. 59, No. 12, Jun. 1986, pp. 4032–4037, American Institute of Physics.

Primary Examiner—Chandra Chaudhari
Attorney, Agent, or Firm—Loeb & Loeb

[57] ABSTRACT

For effecting impurity doping, a chemically active semiconductor surface is covered with an adsorption layer composed of an impurity element which forms a dopant in the semiconductor or composed of a compound containing the impurity element. Thereafter, solid phase diffusion is effected using the adsorption layer as an impurity diffusion source so as to form an impurity-doped region having a desired density profile in the depth direction.

9 Claims, 25 Drawing Sheets

IMPURITY DOPING METHOD WITH ADSORBED DIFFUSION SOURCE

This is a continuation of application Ser. No. 07/928,525 filed Aug. 11, 1992, and now abandoned, which is itself a continuation of application Ser. No. 07/558,427 filed on Jul. 27, 1990, also abandoned.

BACKGROUND OF THE INVENTION

1. Field of the invention

The present invention relates to impurity doping method utilized for forming a semiconductor region having a desired conductivity type and resistivity in fabrication process of a semiconductor device typically in the form of bipolar transistor or insulating gate field effect transistor.

The conventional ion implantation method is one of the typical impurity doping technologies. According to the principles of the ion implantation method, as shown in FIG. 23, firstly, an ion source 16 ionizes impurity atoms, then mass-separation is carried out by a magnet 17, and further an accelerating tube 18 is operated to effect accelerating of ions to a given energy level so as to implant accelerated ions into a surface of a sample, thereby effecting accurate control of impurity doping amount and facilitating impurity doping through an insulating film. For this reason, the ion implantation method has been generally utilized as the impurity doping technology in the conventional semiconductor fabrication process.

However, the conventional ion implantation method has various drawbacks due to its inherent nature as follows:

(i) Damage may be caused on a sample surface due to the kinetic energy of impurity ions to be implanted.

(ii) Since the implanted impurity atoms are distributed in the normal distribution having variance determined by their acceleration energy, it is impossible to form a steep density profile in a deep section as shown in FIG. 24.

(iii) With micronization of semiconductor device, asymmetricity of the device characteristics may be caused due to shadow effect.

(iv) It cannot be easy to form a shallow junction as channeling would be caused.

(v) If ion implantation is carried out with reduced acceleration voltage of impurity ion in order to form a shallow junction, converging degree of ion beam is degraded, resulting in reduction of production throughput.

SUMMARY OF THE INVENTION

An object of the invention is to provide a new impurity doping method effective to form an extremely shallow junction without causing damage to the semiconductor surface or reduction of production throughput.

In order to achieve the above noted object, according to the invention, an impurity element or compound containing an impurity element is chemically adsorbed on a semiconductor surface to form an impurity diffusion source on the semiconductor surface. Further, impurity doping is carried out into the semiconductor bulk through solid phase diffusion of impurity atoms from the impurity diffusion source.

Further, as will be described in detail with reference to embodiments, formation of impurity adsorption layer can be combined with epitaxial growth technology to enable formation of steep impurity distribution profile in a deep section.

As described above, in the inventive method, the impurity doping is based on chemical adsorption of impurity atoms onto a semiconductor surface, hence the doped amount of impurity can be accurately controlled by adjusting substrate temperature and flow rate of gas containing impurity element so as to regulate adsorption amount of impurity. Therefore, uniform and even diffusion of impurity can be effected from the semiconductor surface into the bulk. Moreover, the doping is free of damage. The impurity source is disposed on the semiconductor surface to facilitate advantageously the formation of shallow junction. Generally, the shallower the formed junction, the more the production throughput.

DETAILED DESCRIPTION OF PREFERRED EMBODIMENTS

Figure 1:
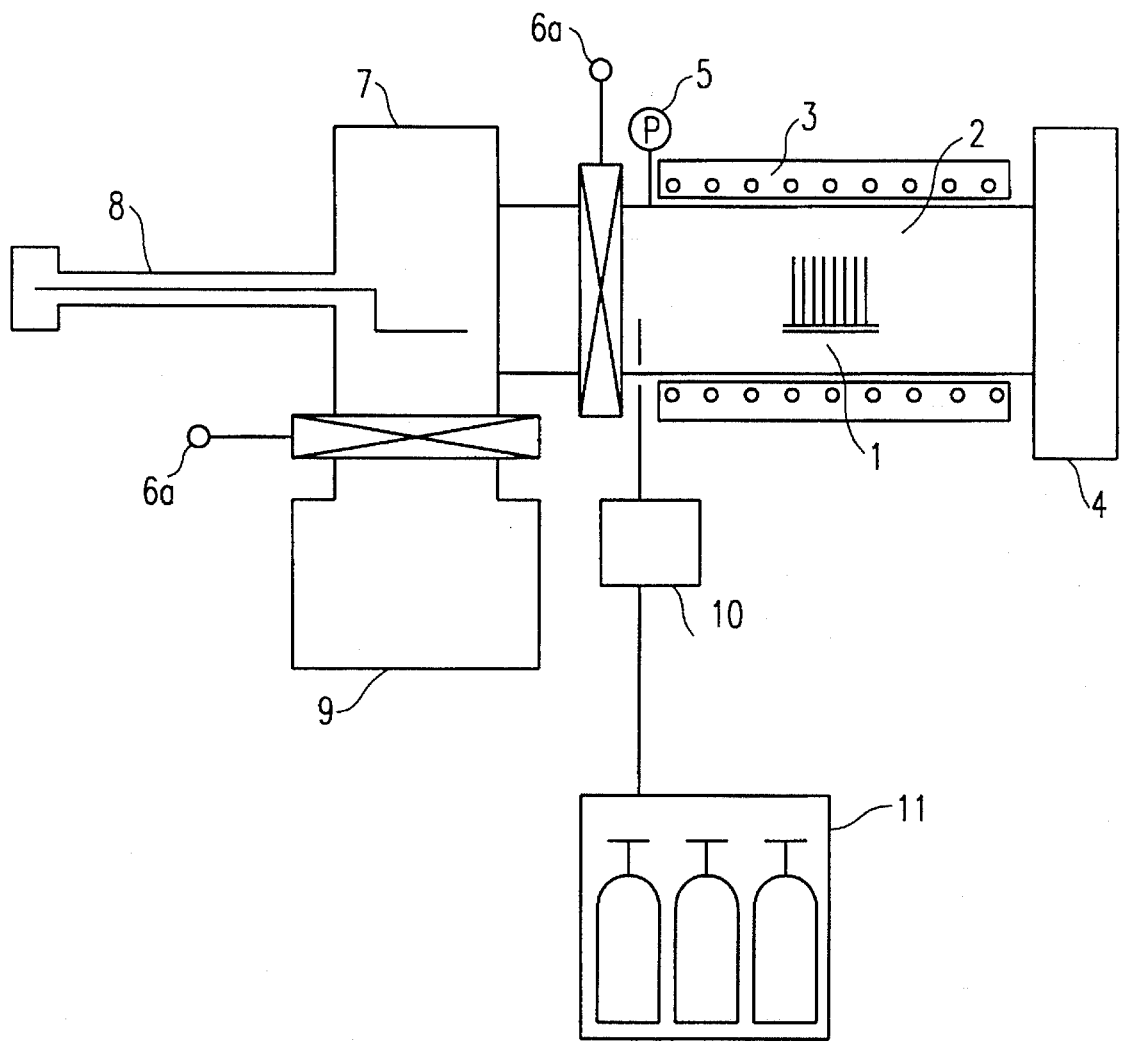
FIG. 1 is a structural view of a production apparatus used for practicing the invention.

Hereinafter, embodiments of the inventive impurity doping method will be described in detail with reference to FIGS. 1–22(d). FIG. 1 is a schematic diagram of an apparatus used in practicing the invention. In FIG. 1, a silicon substrate 1 is set in the center of a chamber 2 made of quartz. The temperature of substrate 1 is maintained at a given value by controlling a heating system 3 utilizing infra-red ray lamp heating or resistance heating. The interior of chamber 2 is evacuated to a high vacuum degree by means of a high vacuum evacuation system 4 comprised of plural pumps including a main vacuum pump in the form of a turbo-molecular pump. Degree of vacuum inside the chamber 2 is monitored by a pressure gage 5. The silicon substrate 1 is transported by means of a transportation mechanism 8 between the chamber 2 and a load chamber 7 which is connected to the main chamber 2 through a gate valve 6a which is held open during the transportation. The load chamber 7 is normally evacuated at high vacuum by means of a load chamber evacuation system 9 while opening another gate valve 6b other than during the course of loading of the silicon substrate 1 into the load chamber 7 and during the transportation thereof. A gas supply source 11 introduces various gases into the chamber 2. A gas charging control system 10 is used to control charge amount of gas and charging mode etc.

Figure 2A:
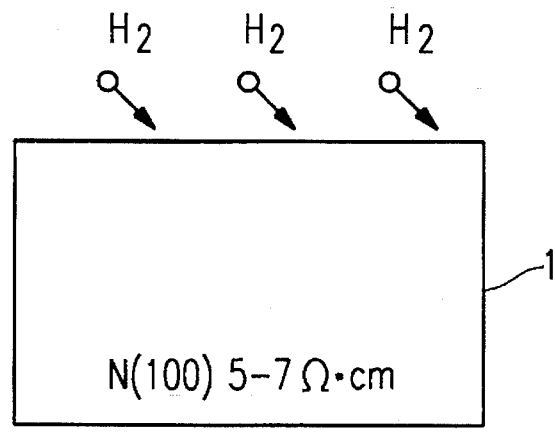
FIGS. 2(a)–2(c) are a step sequence sectional diagram showing a first embodiment of the invention for impurity doping.
Figure 2B:
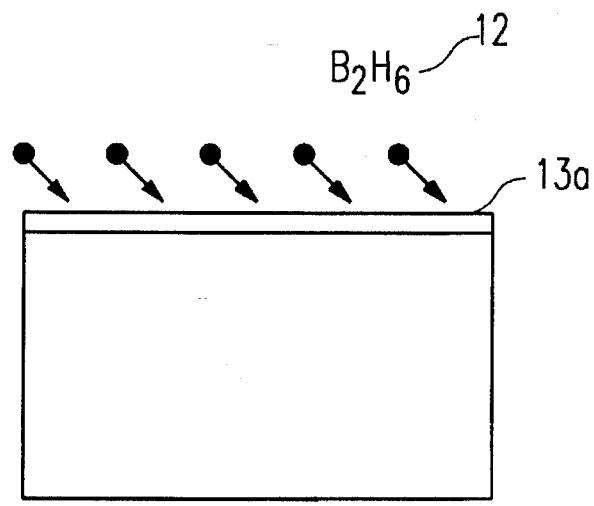
Figure 2C:
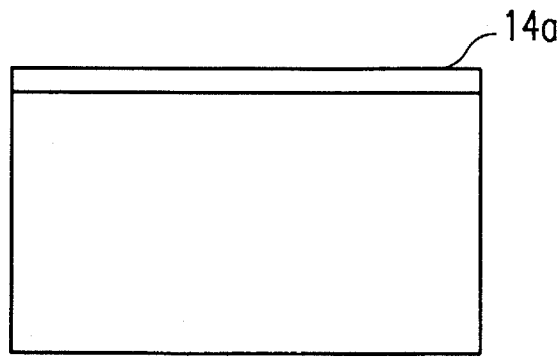

FIGS. 2(a)–2(c) are a fabrication step diagram showing a first embodiment of the inventive impurity doping method. Referring to FIGS. 29(a)–2(c), the description is given for the embodiment wherein boron of P type impurity is doped into a silicon semiconductor. In the step of FIG. 2(a), a surface of silicon substrate 1 is cleaned. The silicon substrate 1 is set in the center of the vacuum chamber which is held at background or base pressure of less than $1\times10^{-4}$ Pa. While setting the substrate temperature, for example, at 850° C., hydrogen gas is introduced for a predetermined time interval to boost pressure inside the chamber, for example, up to $1.3\times10^{-2}$ Pa. By this treatment, an inert film in the form of a natural oxide film is removed from the surface of the silicon substrate 1 so as to expose a chemically active silicon surface.

In the step of FIG. 2(b), an adsorption layer 13a is formed of boron or compound containing boron on the surface of silicon substrate 1. After cleaning of the surface in the FIG. 2(a) step, charging of hydrogen gas is stopped and the substrate temperature is set, for example, at 825° C. After reaching stably the set temperature, boron-containing compound gas in the form of diborane 12 ($B_2H_6$) is applied to the surface of silicon substrate 1 for a given time interval to fill the chamber, for example, at $1.3\times10^{-2}$ Pa of pressure to thereby form the adsorption layer 13a of boron or boron-containing compound.

However, strictly speaking, in the step of FIG. 2(b), concurrently with the formation of the adsorption layer of boron or boron-containing compound, diffusion or boron also progresses into the silicon bulk. Hereinafter, the step indicated by FIG. 2(b) is referred to as "the step of forming impurity adsorption layer" in the present and following embodiments.

In the step of FIG. 2(c), annealing and diffusion are effected. After forming the adsorption layer 13a in the FIG. 2(b) step, charging of diborane is stopped to carry out annealing in vacuum to thereby effect concurrently the formation of impurity-diffused layer 14a with using the adsorption layer as a diffusion source and activation of impurity atoms. According to the invention, by controlling adsorption amount of boron in the FIG. 2(b) step and annealing conditions in the FIG. 2(c) step, i.e., temperature and time interval, desired impurity density and junction depth can be established in the formed impurity-diffused layer 14a.

In this embodiment, annealing is carried out in the vacuum chamber shown in FIG. 1 subsequently to the formation of the adsorption layer 13a. Otherwise, lamp annealing may be carried out for the substrate 1 taken from the apparatus shown in FIG. 1 after completion of the FIG. 2(b) step.

Figure 3:
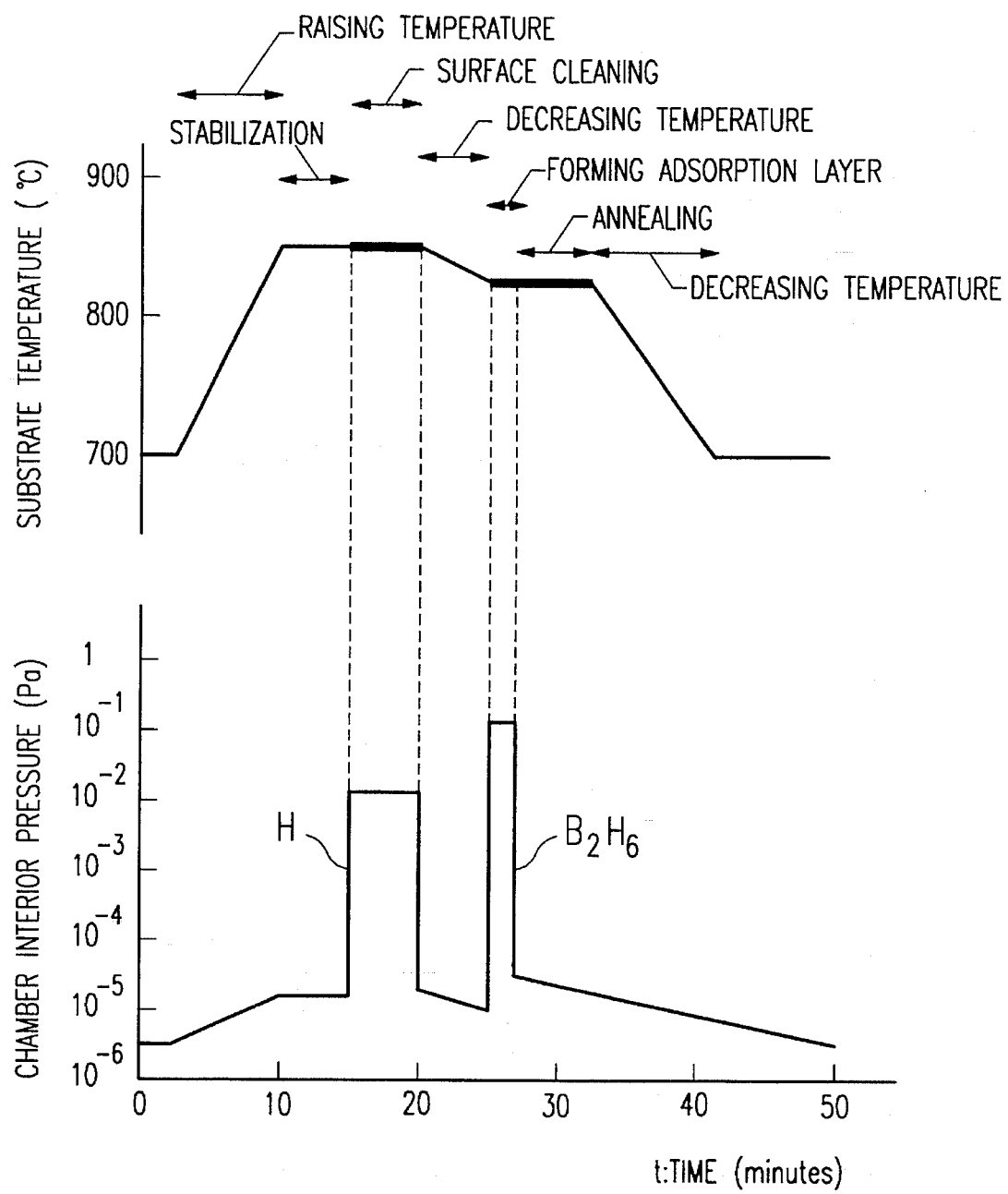
FIG. 3 is a process sequence chart corresponding to the steps of FIGS. 2(a)–2(c)

FIG. 3 shows an example of a process sequence chart corresponding to the sequence of steps represented by FIGS. 2(a)–2(c). In the FIG. 3 chart, horizontal axis indicates time and vertical axis indicates substrate temperature and chamber pressure. In the diagram, the substrate temperature is initially set at 700° C. when the t=0. This means that in actual process the ambient temperature is maintained at 700° C. within the chamber during transporting of the substrate so that the substrate temperature almost reaches 700° C. at the time of completing transportation of the substrate into the chamber. As indicated in the FIG. 3 chart, the main steps of the inventive method include cleaning of the semiconductor surface, forming of the adsorption layer and annealing as described in detail with reference to FIGS. 2(a)–2(c). As understood from FIG. 3, the inside pressure of the chamber is normally held at high vacuum less than $1\times10^{-4}$ Pa when a gas is not introduced thereinto. However, the background or base pressure of less than $1\times10^{-4}$ Pa is not critical in this inventive method, but optimum base pressure can be set according to the substrate temperature in the surface cleaning step and according to ambient gas within the chamber.

Figure 4:
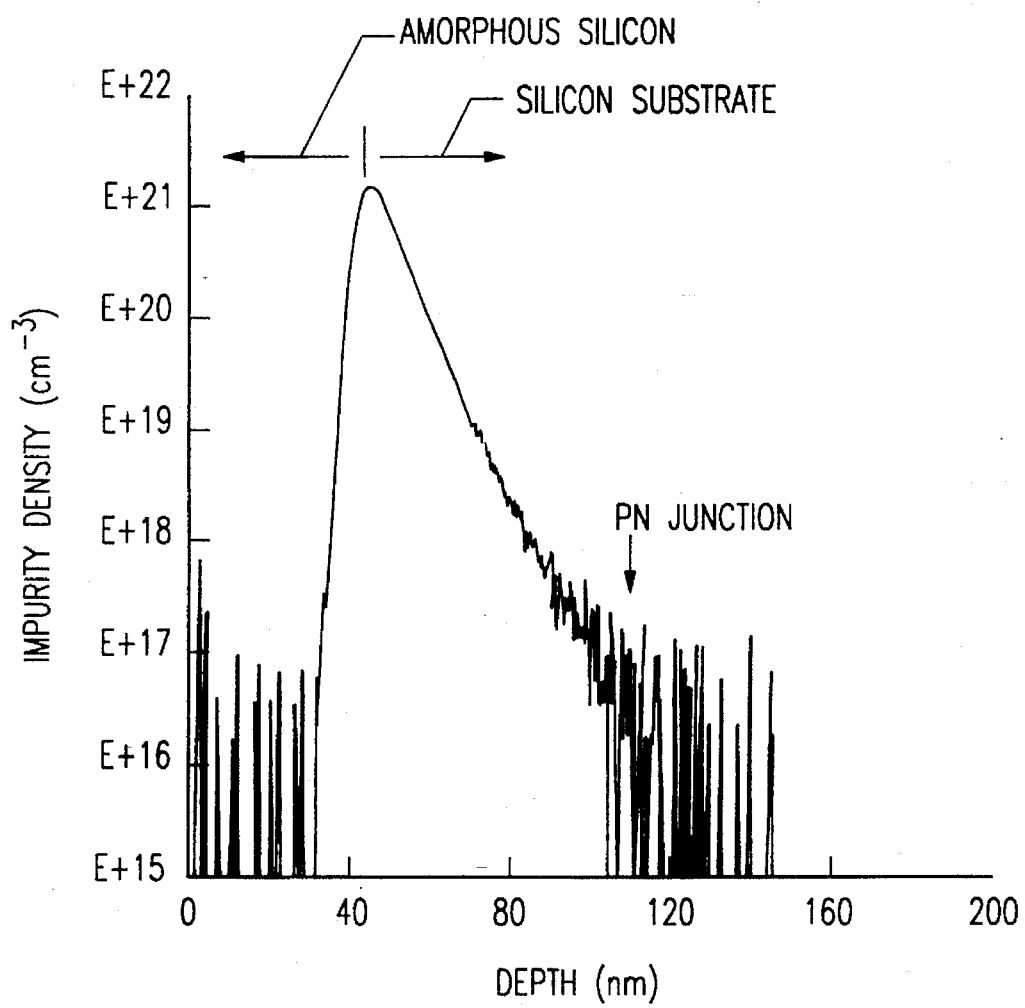
FIG. 4 is a boron density profile of depth direction for a boron-doped layer obtained by the sequence of steps shown in FIGS. 2(a)–2(c) and FIG. 3.

FIG. 4 is a density profile of boron in depth direction for a sample produced by sequential steps shown in FIGS. 2(a)–2(c) as well as FIG. 3. The boron profile shown in FIG. 4 is obtained by using a secondary ion mass spectrometer (SIMS). In order to improve SIMS analysis accuracy on a substrate surface of the sample, the sample is taken from the FIG. 1 apparatus after completing the annealing treatment, and thereafter the sample is covered on its substrate surface with an amorphous silicon layer formed under the room temperature at the thickness of about 450 Å for the preparation of the SIMS analysis. Therefore, it should be noted that the original substrate surface is indicated at about 45 nm of distance along the horizontal axis in the FIG. 4 graph. The utilized silicon substrate is of N type having 5–7 Ωcm of resistivity and (100) of crystal face orientation. Further, diborane is introduced during the step of FIG. 2(b) under the following conditions: charging pressure $1.3 \times 10^{-2}$ Pa; charging time interval 100 seconds; and substrate temperature 825° C. for 5 minutes. As seen from FIG. 4, the sample has a quite shallow $P^+N$ junction depth in the order of 700 Å. Therefore, according to the present invention, generally a quite shallow junction can be formed in less than 0.1 μm of junction depth.

Figure 5:
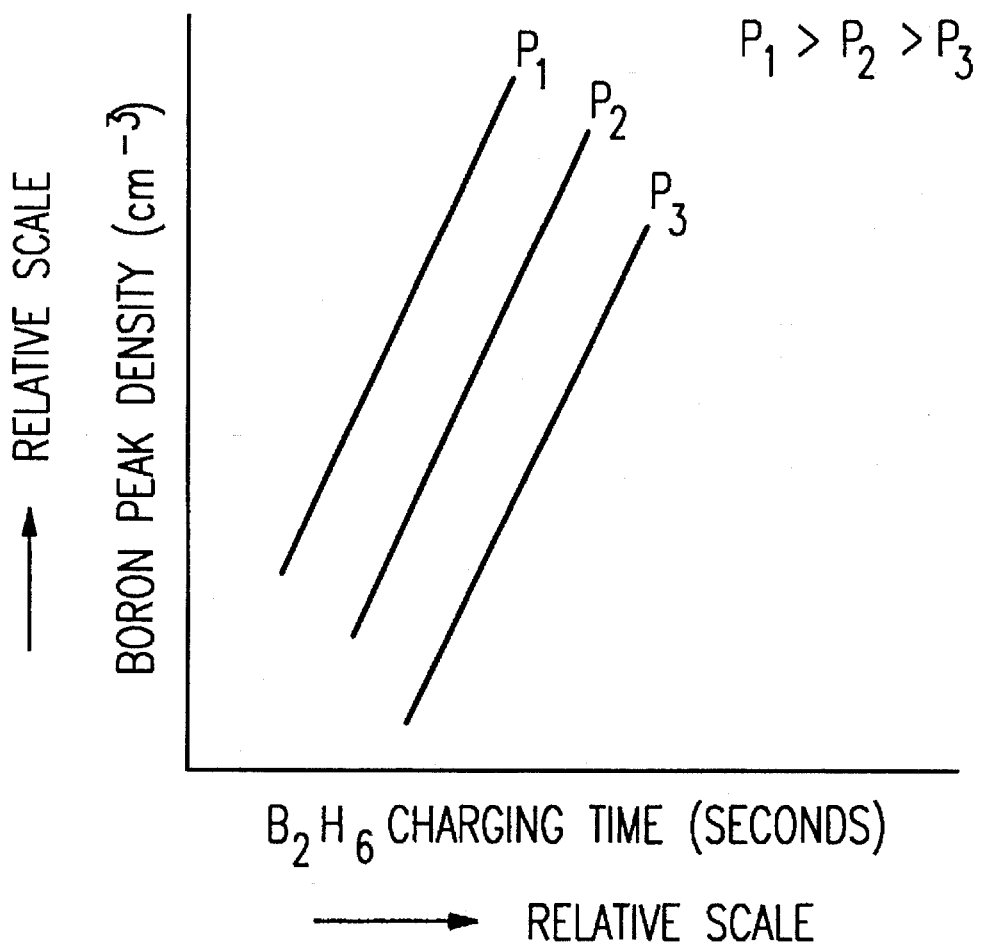
FIG. 5 is a characteristic diagram showing dependency of boron peak density in the boron-doped layer, on diborane charging time interval where diborane charging pressure is selected as a parameter in the sequence of the steps shown in FIGS. 2(a)–2(c) and FIG. 3.

FIG. 5 is a characteristic diagram showing dependency of boron peak density or concentration, on diborane charging time interval while diborane charging pressure P is set as a parameter for preparing samples by the steps of FIGS. 2(a)–2(c) and FIG. 3. On the other hand, the substrate temperature during the charging of diborane and the annealing conditions after formation of the adsorption layer are fixed.

Figure 6:
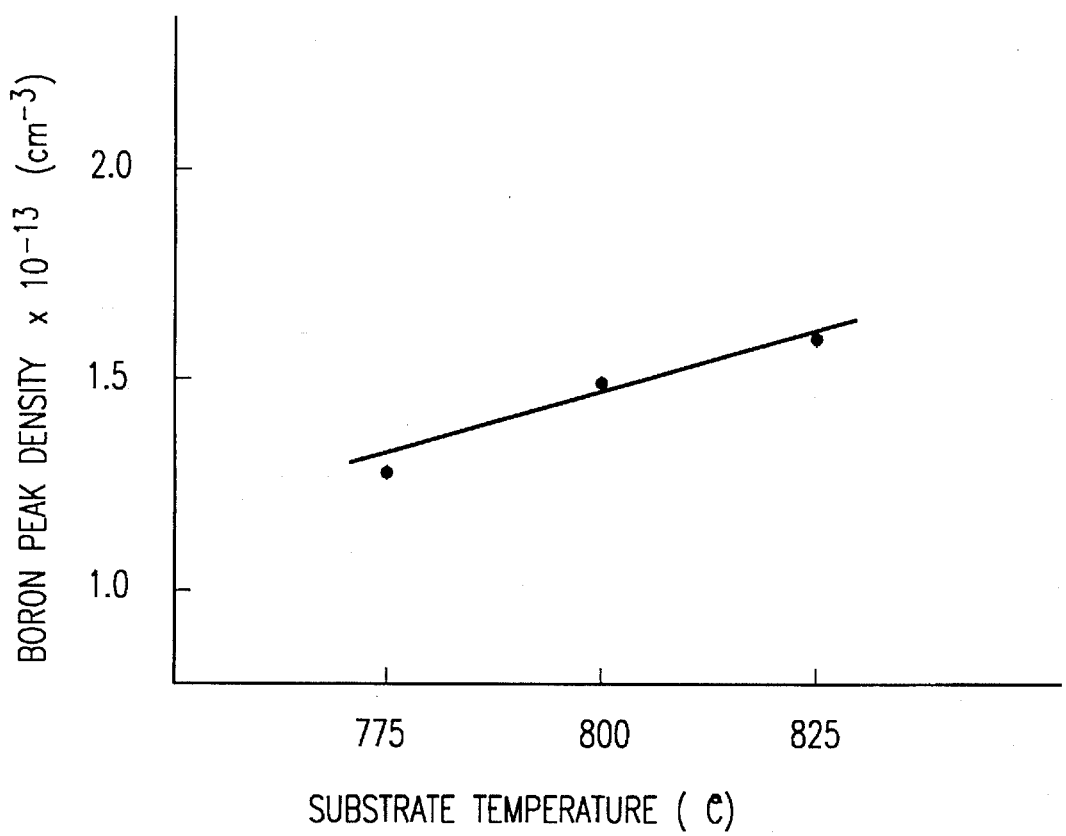
FIG. 6 is a characteristic diagram showing dependency of boron peak density in the boron-doped layer obtained from the sequence of steps shown by FIGS. 2(a)–29(c) and FIG. 3, on the substrate temperature set in the charging process of diborane.

FIG. 6 is another characteristic diagram showing dependency of boron peak density in the impurity layer obtained by the sequential steps of FIG. 2(a)–2(c) and FIG. 3, on the substrate temperature during the charging of diborane. In this case, charging amount of diborane and annealing conditions are fixed.

The above description has been directed to the first embodiment of the present invention as indicated by FIGS. 2(a)–2(c) with using the FIG. 1 apparatus. The following description is directed to a second embodiment of this invention which will be explained in detail in conjunction with FIGS. 7(a)–7(d), FIG. 8 and FIG. 9. In the embodiment of FIGS. 7(a)–7(d), an adsorption layer of boron is formed on a silicon substrate. Thereafter, an epitaxial growth layer of silicon is formed on the adsorption layer. In the FIG. 7(a) step, a surface of the silicon substrate 1 is activated in manner similar to the FIG. 2(a) step. In the FIG. 7(b) step, an impurity adsorption layer 13b is formed in manner similar to the FIG. 2(b) step. This embodiment is characterized in that the FIG. 7(c) step is added to form an epitaxial growth layer 15a provided over the impurity adsorption layer 13b formed in the FIG. 7(b) step. In the FIG. 7(d) step, annealing is then carried out if desired to provide an impurity-diffused layer 14b.

Figure 7A:
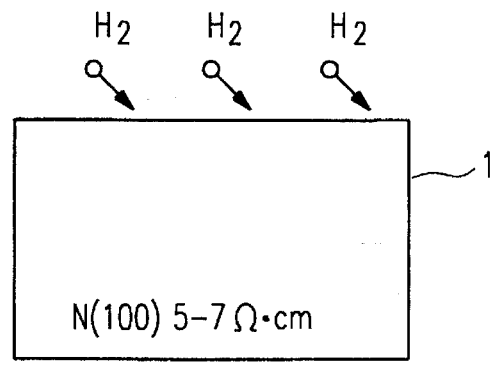
FIGS. 7(a)–7(d) are a step sequence sectional diagram showing a second embodiment of the invention for doping impurity.
Figure 7B:
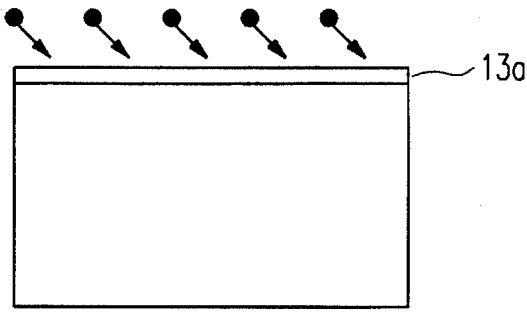
Figure 7C:
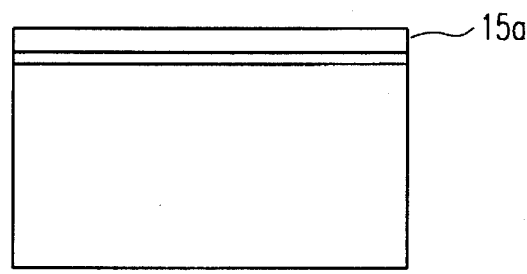
Figure 7D:
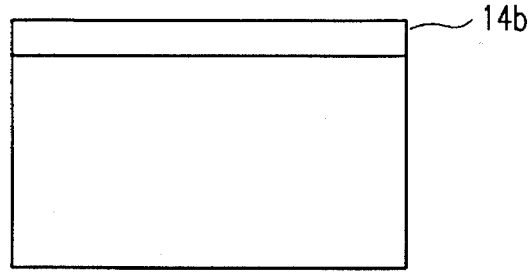
Figure 8:
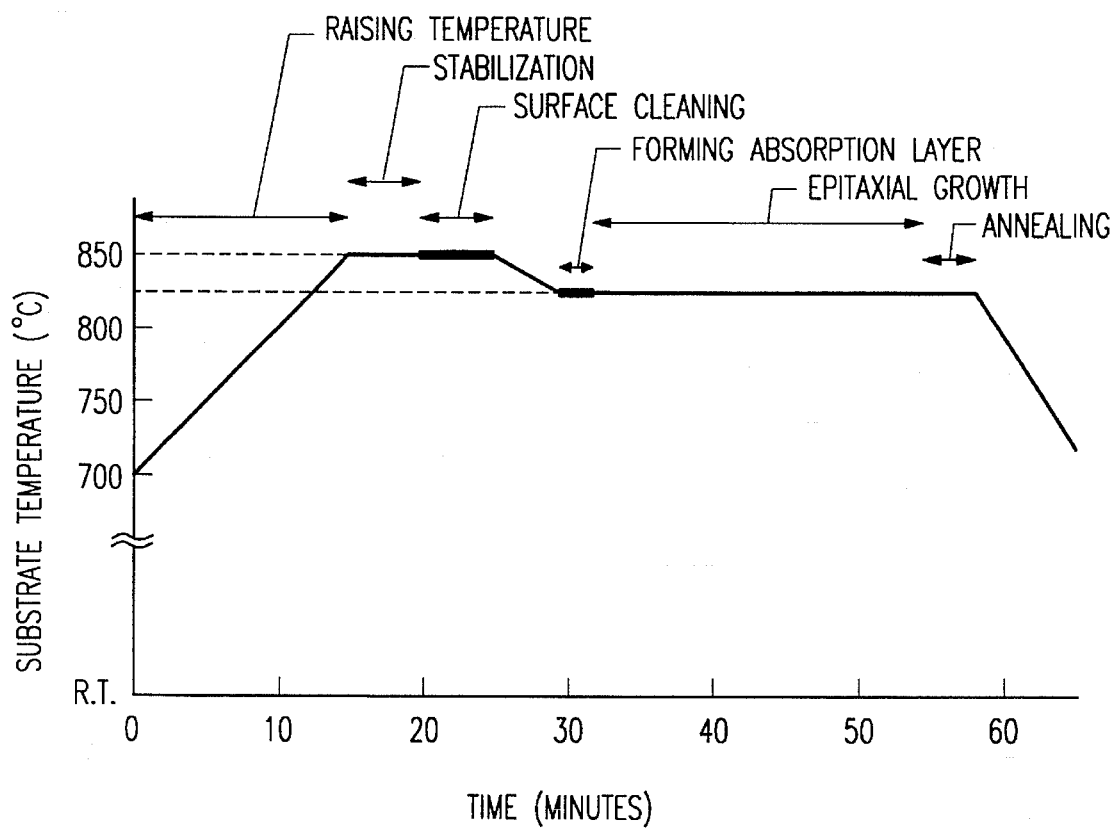
FIG. 8 is a process sequence chart corresponding to the FIGS. 7(a)–7(d) steps.

FIG. 8 is an example of an actual process sequence chart corresponding to the sequence of the FIGS. 7(a)–7(d) steps. In FIG. 8, the horizontal axis denotes processing time and the vertical axis denotes substrate temperature. As shown in FIG. 8, immediately after completing the formation of the impurity adsorption layer due to application of diborane, the process proceeds to the step of epitaxial growth. In other cases, however, an annealing step may be added before the step of epitaxial growth.

Figure 9:
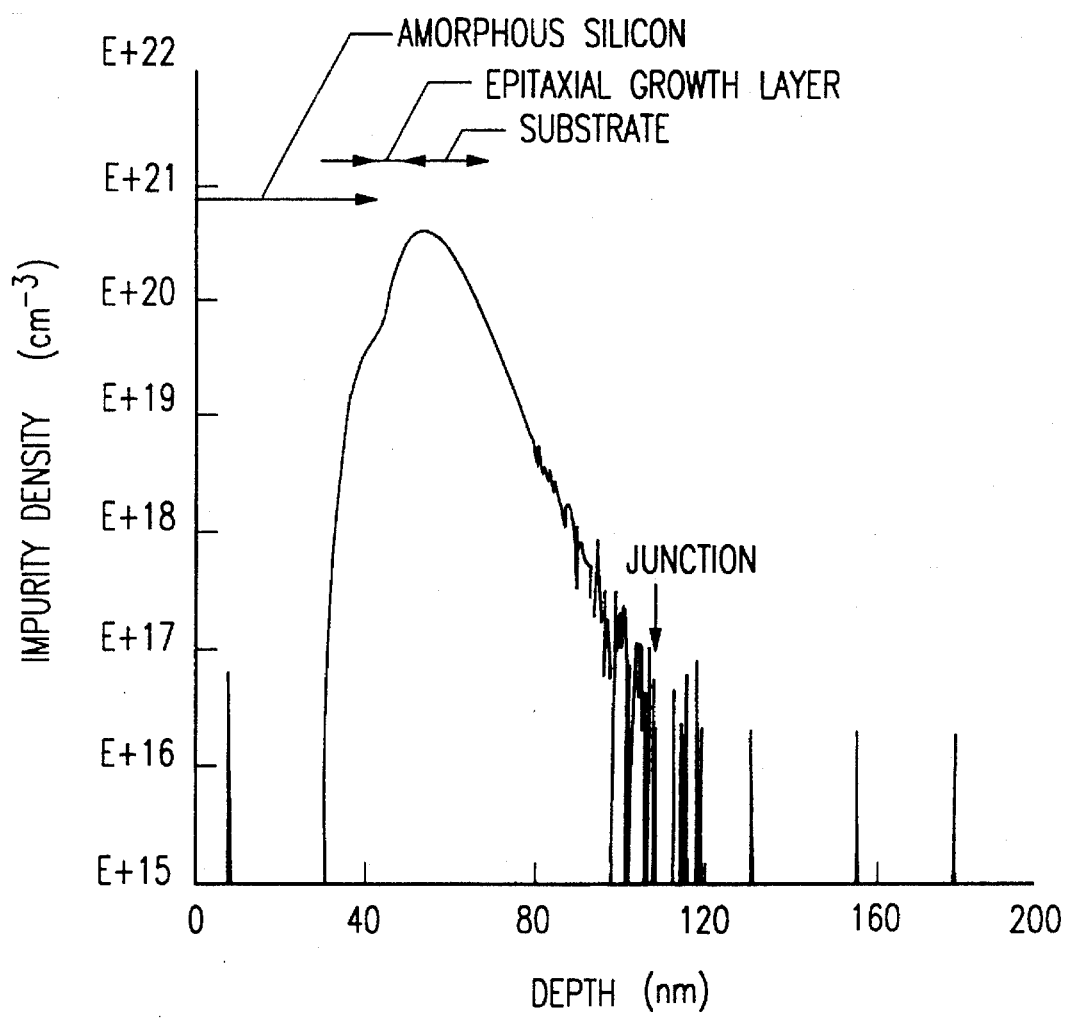
FIG. 9 is a boron density profile of the depth direction for the boron-doped layer obtained by the sequence of the steps shown in FIGS. 7(a)–7(d) and FIG. 8.

FIG. 9 shows boron density profile, in depth direction, of the boron-doped layer obtained by the sequential steps shown in FIGS. 7(a)–7(d) and FIG. 8. In case of FIG. 9, the impurity adsorption layer is formed in the diborane application step of FIG. 7(b) under the following condition: substrate temperature 825° C.; diborane charging pressure $1.3 \times 10^{-2}$ Pa; and diborane charging time interval 100 seconds. Thereafter, the epitaxial growth layer of about 60 Å is formed in the FIG. 7(c) step on the adsorption layer at the same substrate temperature. Further, in the FIG. 7(d) step, vacuum annealing is effected at the same substrate temperature for 5 minutes, thereby obtaining the FIG. 9 profile. As understood by the FIG. 9 profile, the substrate is formed in its surface with $P^+$ region having $4 \times 10^{20} cm^{-3}$ of peak density and about 700 Å of junction depth. Prior to measuring of the FIG. 9 profile, an amorphous silicon layer is provided on the substrate by about 450 Å thickness at room temperature in order to improve accuracy of the SIMS analysis in manner similar to the FIG. 4 case.

Figure 10:
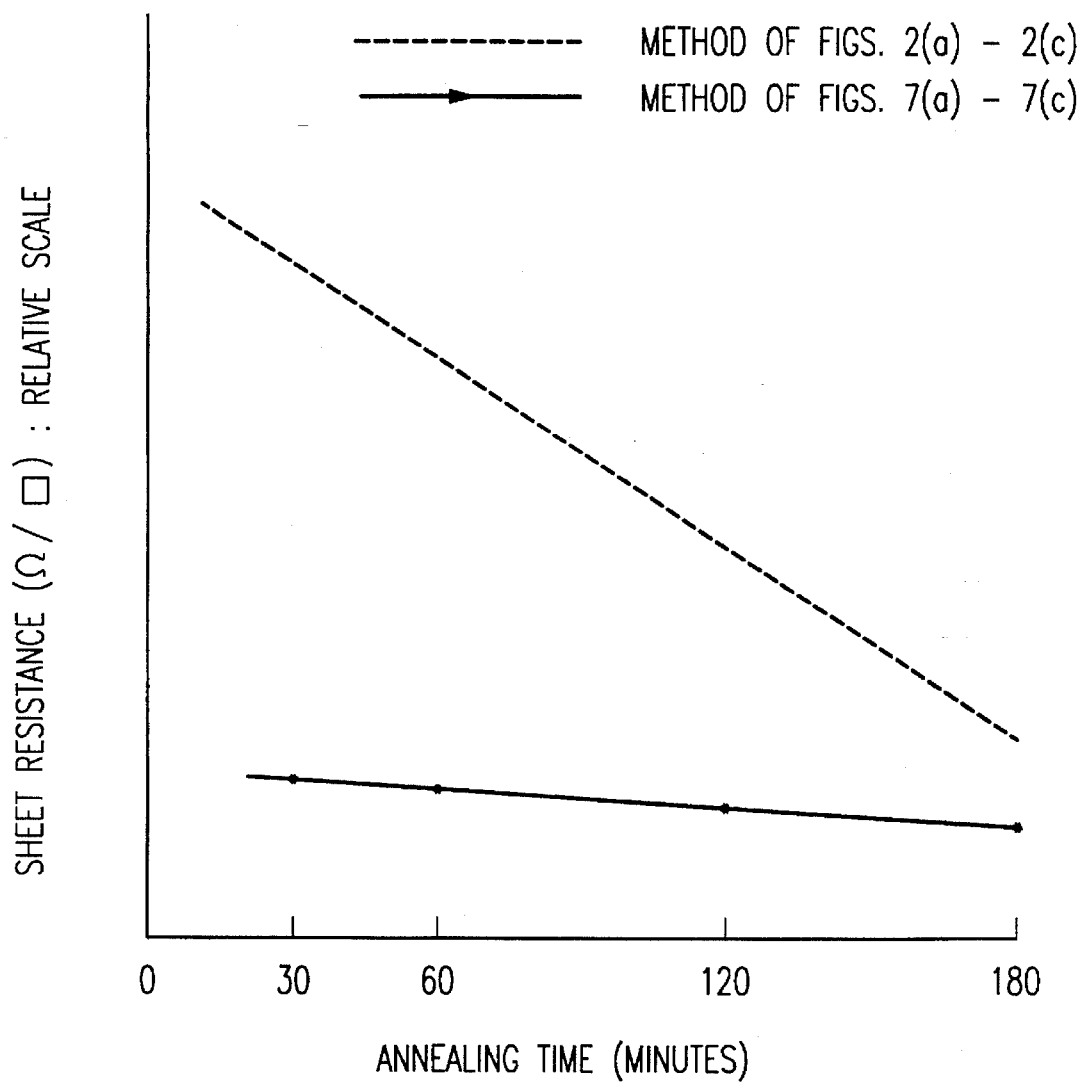
FIG. 10 is a characteristic diagram showing dependency of sheet resistance of the boron-doped layer, on annealing time interval for respective samples made according to the methods of FIGS. 2(a)–2(c) and FIGS. 7(a)–7(d)

It is recognized by the inventors that the method shown by FIGS. 7(a)–7(d) can promote activation of boron in high concentration doping as compared to the method shown by FIGS. 2(a)–2(c). FIG. 10 shows such data, indicating how sheet resistance in the different impurity-doped layers formed, respectively, by the FIGS. 2(a)–2(c) method and the FIGS. 7(a)–7(d) method depends on the annealing time interval. In FIG. 10, the solid line indicates data obtained when the FIGS. 7(a)–7(d) method is utilized, and the broken line indicates data obtained when the FIGS. 2(a)–2(c) method is utilized. In view of the fact that the substrate temperature is set at 825° C. in the FIG. 7(c) step and the epitaxial growth is finished within 30 minutes, it is readily understood that the difference between the solid line and the broken line in the FIG. 10 graph is not caused simply by processing time variation. Of course, the sample data shown in FIG. 10 is obtained by fixing the substrate temperature at 825° C. in both of the FIGS. 2(a)–2(c) method and the FIGS. 7(a)–7(d) method.

In this embodiment, the epitaxial growth layer 15 is formed in the FIG. 7(c) step by means of molecular layer epitaxy with using dichlorosilane ($SiH_2Cl_2$) as a source gas. By this epitaxy, the epitaxial growth layer 15a having less than 100 Å of film thickness can be formed at 825° C. of substrate temperature with good repeatability in this embodiment. The molecular layer epitaxy is disclosed in Japanese patent application Nos. 153978/1984 and 209575/1986. The epitaxial growth layer 15a may be formed by other methods such as molecular beam epitaxy (MBE) and chemical vapor deposition (CVD) instead of molecular layer epitaxy.

The foregoing description has been directed to the second embodiment of the invention characterized in that the epitaxial growth layer is formed over the impurity-doped layer. In turn, the next description is given for a third embodiment of the invention with reference to FIGS. 11(a)–11(d), FIG. 12 and FIG. 13, where an impurity adsorption layer is formed over a precedingly formed epitaxial growth layer. FIGS. 11(a)–11(d) are a sequential step diagram of the third embodiment of the invention. In the FIG. 11(a) step, surface cleaning is carried out in the same manner as in the FIG. 2(a) and FIG. 7(a) steps. In the FIG. 11(b) step, an epitaxial growth layer 15b is formed over a substrate 1 by means of the molecular layer epitaxy in the same manner as the FIG. 7(c) step. Thereafter in the FIG. 11(c) step, an impurity adsorption layer 13c is formed. Further in the FIG. 11(d) step, annealing is carried out if desired to form an impurity-diffused layer 14c.

Figure 11A:
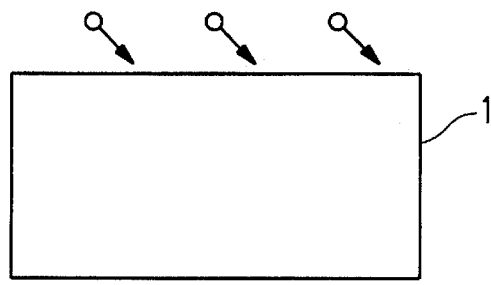
FIGS. 11(a)–11(d) are a step sequence sectional diagram showing a third embodiment of the invention for doping impurity.
Figure 11B:
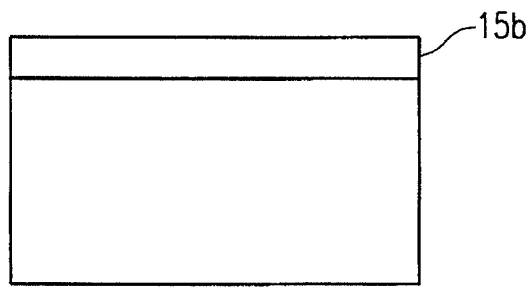
Figure 11C:
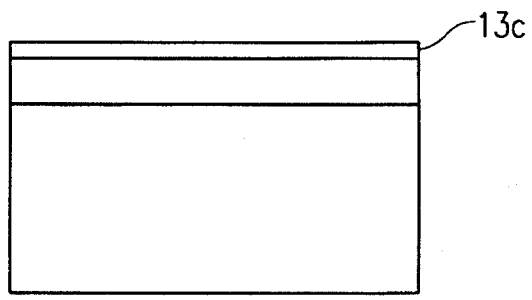
Figure 11D:
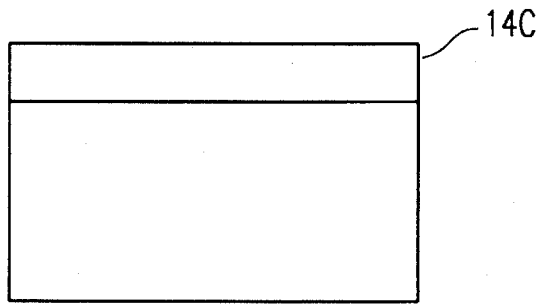
Figure 12:
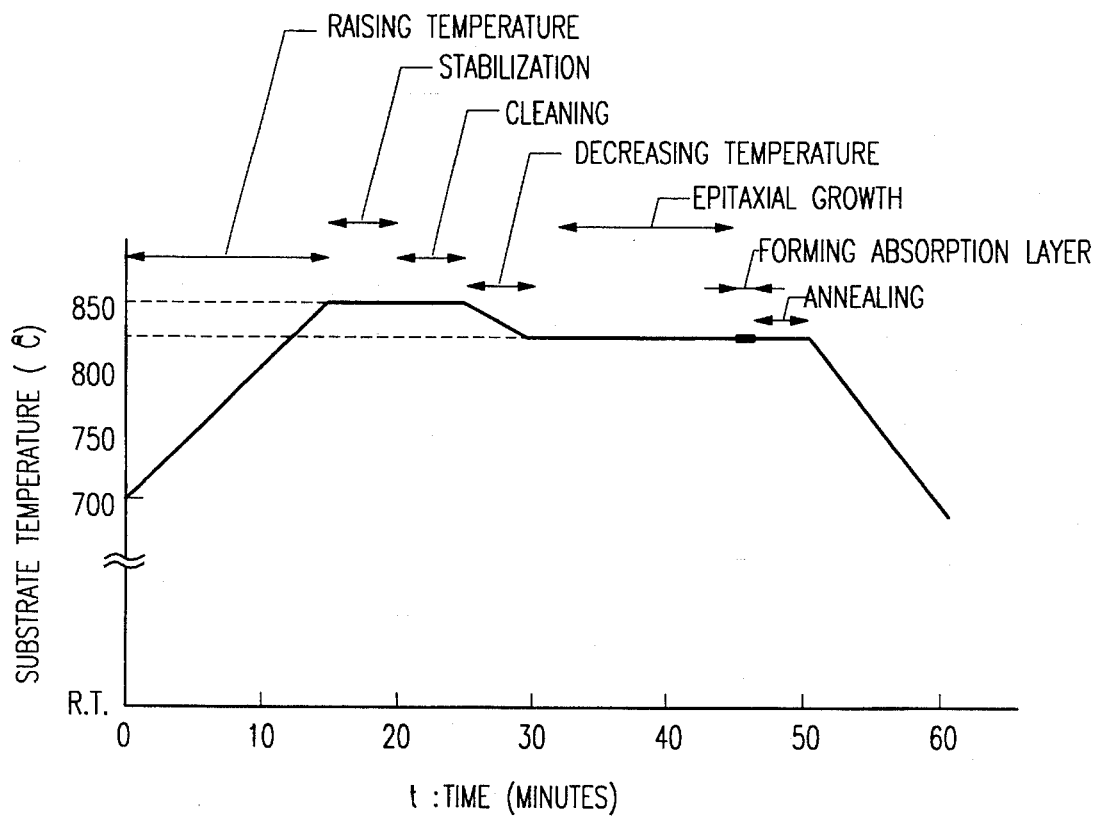
FIG. 12 is a process sequence chart corresponding to FIGS. 11(a) 11(d) steps.

FIG. 12 is an actual process sequence chart corresponding to the steps shown by FIGS. 11(a)–11(d). The horizontal axis denotes processing time and the vertical axis denotes substrate temperature.

Figure 13:
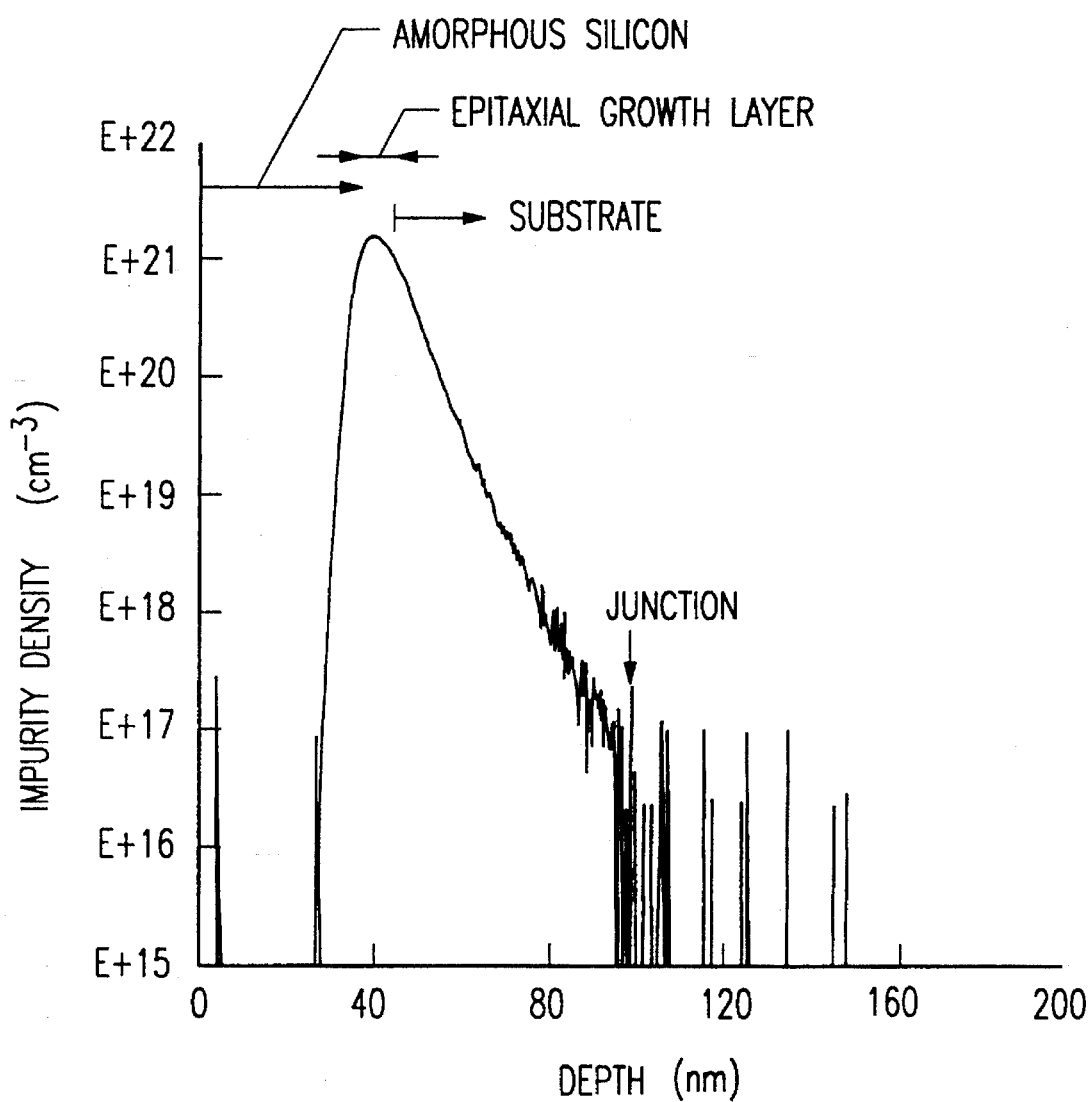
FIG. 13 is a boron density profile of the depth direction in the boron-doped layer obtained by the method shown in FIGS. 11(a)–11(d) and FIG. 12.

FIG. 13 is a boron density profile, in the depth direction, of impurity-diffused layer 14c shown in FIG. 11(d). In making a sample, an epitaxial growth layer of about 50 Å thickness is formed in the FIG. 11(b) step according to the FIG. 12 chart at 825° C. of the substrate temperature. Thereafter, in the FIG. 11(c) step, an adsorption layer 13c is formed at the same substrate temperature under the following conditions: diborane charging pressure $1.3\times10^{-2}$ Pa; and diborane charging time 100 seconds. Further, annealing is carried out in vacuum for 5 minutes at the same substrate temperature. Also in this case, an amorphous silicon layer of about 400 Å is formed on the substrate surface in manner similar to the FIG. 4 and FIG. 10 cases. As seen from FIG. 13, there is formed a $P^+$ region having $1.5\times10^{21}$ $cm^{-3}$ of peak density and about 600 Å of junction depth.

Figure 15:
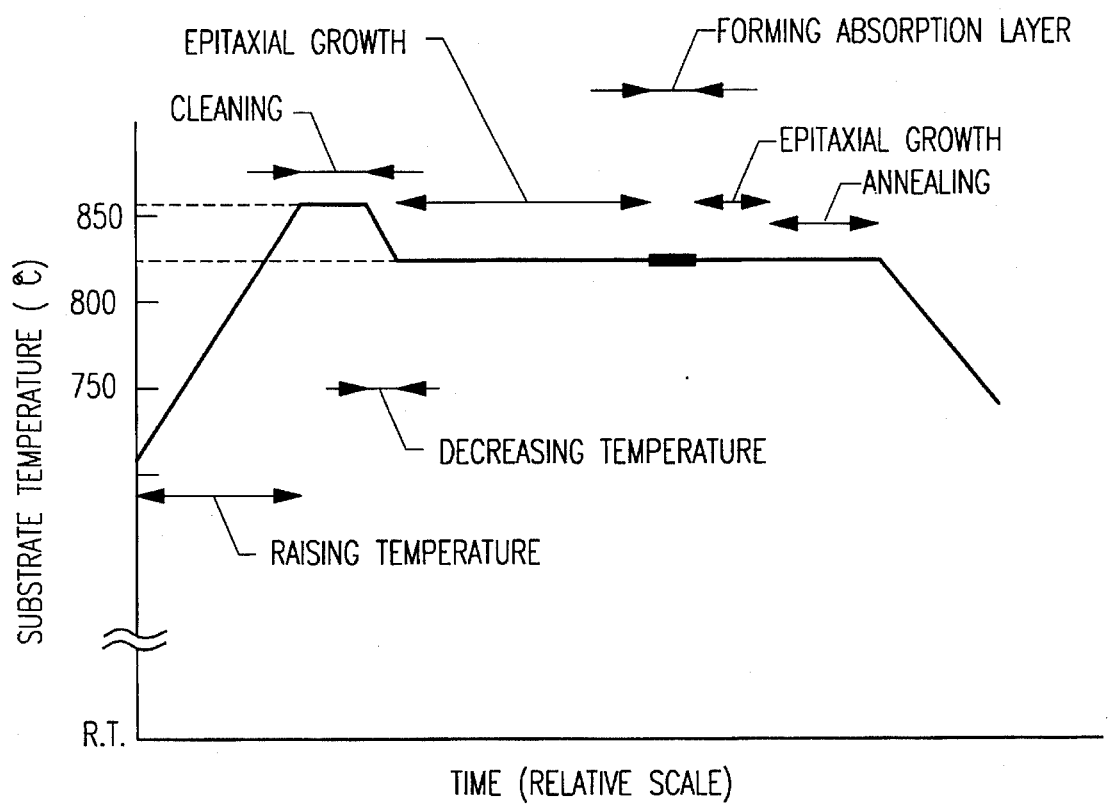
FIG. 15 is a process sequence chart corresponding to the steps of FIGS. 14(a)–14(e)
Figure 16:
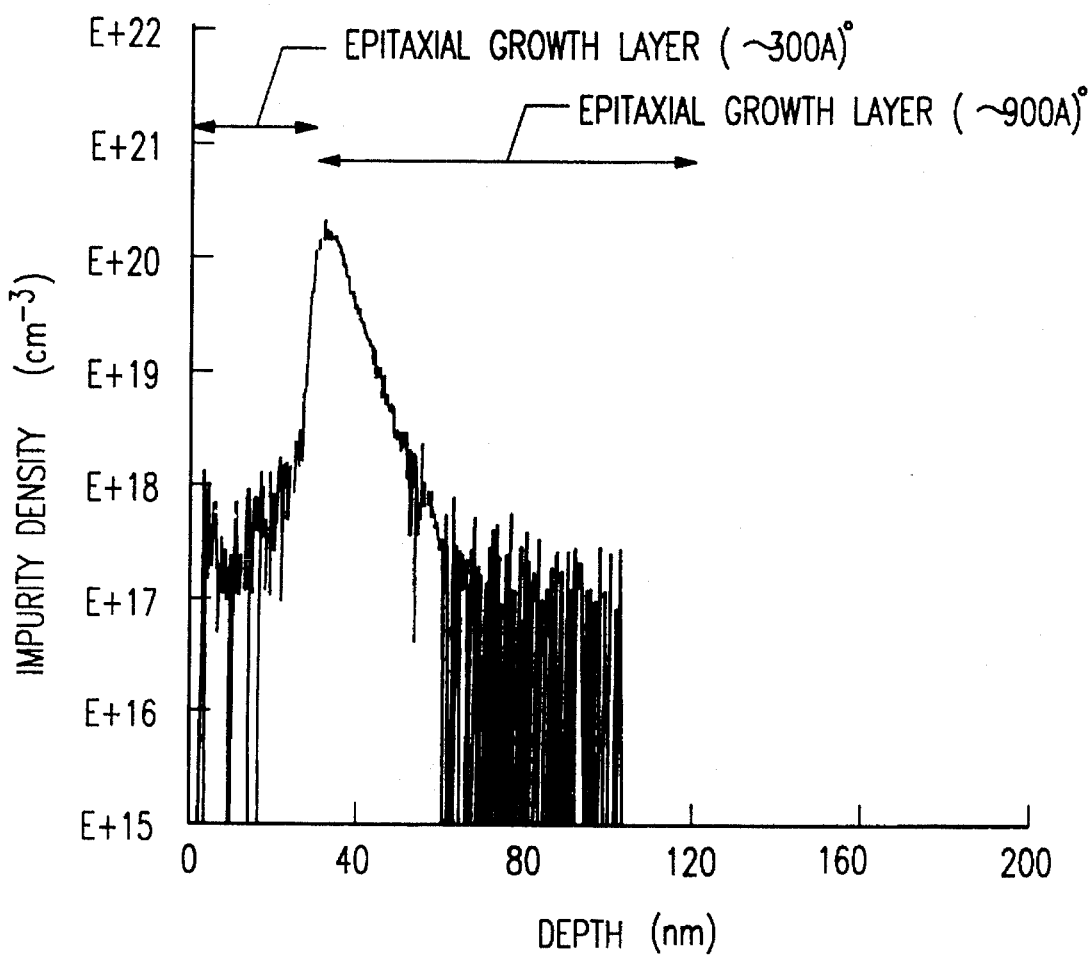
FIG. 16 is a boron density profile of the depth direction in the boron-doped layer obtained by the method shown in FIGS. 14(a)–14(e) and FIG. 15.
Figure 17:
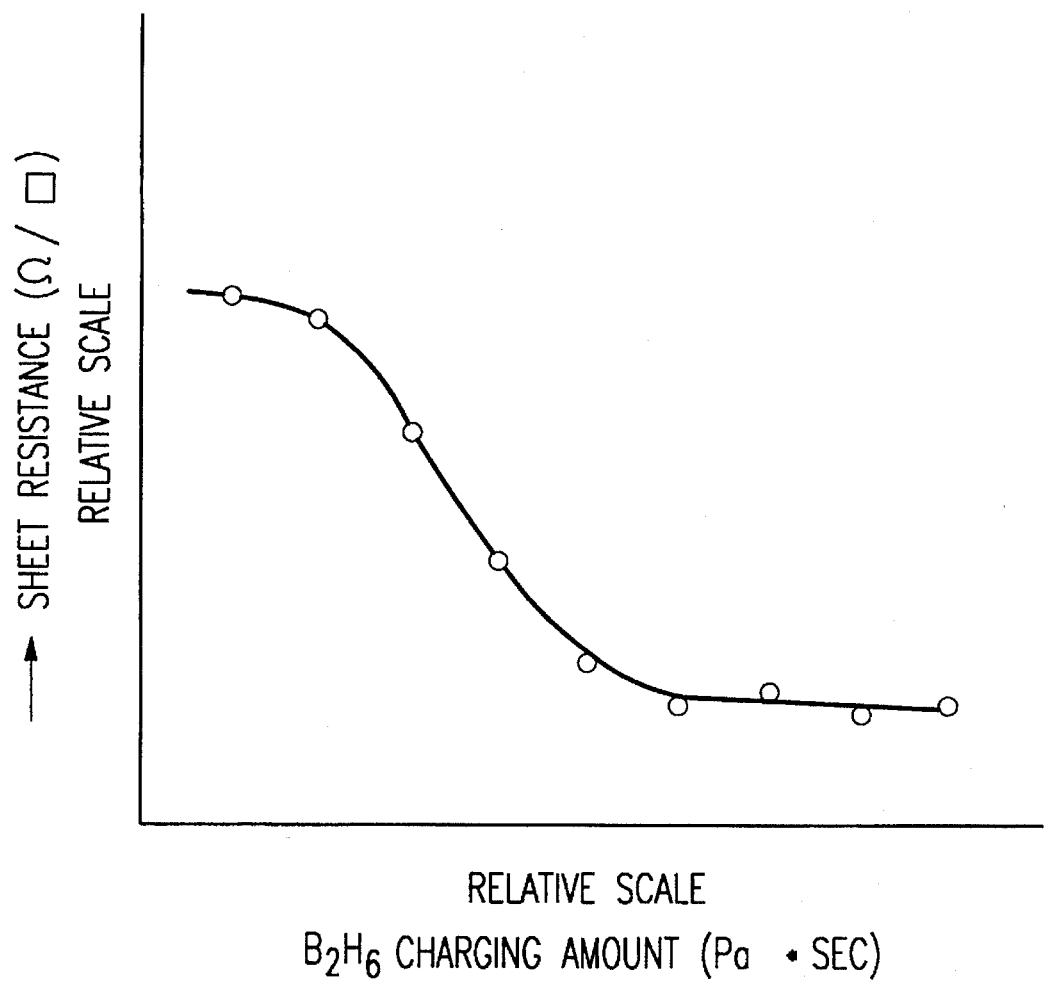
FIG. 17 is a characteristic diagram showing dependency of sheet resistance of the boron-doped layer on diborane charging amount.

FIGS. 14(a)–14(e) are a step sequence diagram showing a fourth embodiment of the invention which is a combination of the FIGS. 7(a)–7(d) process and the FIGS. 11(a)–11(d) process. The steps of FIGS. 14(a)–14(c) correspond to those of FIGS. 11(a)–11(c), and the steps of FIGS. 14(d)–14(e) correspond to those of FIGS. 7(b)–7(d). FIG. 15 is an example of actual process sequence chart representative of the FIGS. 14(a)–14(e) step sequence. The horizontal axis denotes processing time and the vertical axis denotes substrate temperature. FIG. 16 is a boron density profile, in the depth direction, of an impurity-doped layer which is obtained by sequential processing shown in FIGS. 14(a)–14(e) and FIG. 15. The density profile shown by FIG. 16 is obtained according to the following condition. Namely, an epitaxial growth layer 15c of 900 Å is formed at 825° C. of the substrate temperature in the FIG. 14(b) step. Thereafter in the FIG. 14(c) step, and adsorption layer 13d is formed according to the condition that the diborane charging pressure and charging time are $1.3\times10^{-3}$ Pa and 100 seconds, respectively, in the FIG. 14(c) step. Further, an epitaxial growth layer 15d of about 300 Å is formed in the FIG. 14(d) step. Thereafter, vacuum annealing is undertaken for 5 minutes. FIG. 17 is a characteristic diagram showing dependency of sheet resistance of the impurity-doped layer 14d obtained through the sequence of the FIGS. 14(a)–14(e) steps, on diborane charging amount. All of samples measured in the FIG. 17 case are formed on the same N type silicon substrate at the same diborane charging pressure while diborane charging time is varied. The substrate temperature is commonly set throughout all the samples during the course of diborane-charging and annealing. Further, the epitaxial growth layers disposed over and under the impurity adsorption layer have, respectively, a thickness of about 50 Å, set in common for all of the samples. Moreover, the epitaxial growth layer is formed at 825° C.

Figure 14A:
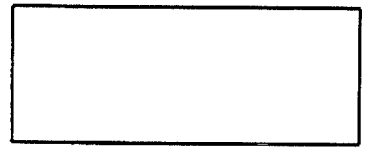
FIGS. 14(a)–14(e) are a step sequence sectional diagram showing a fourth embodiment of the invention for doping impurity.
Figure 14B:
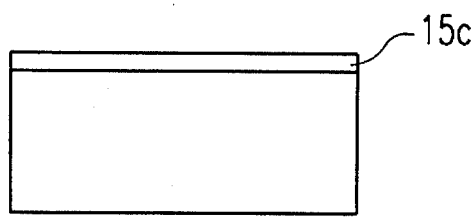
Figure 14C:
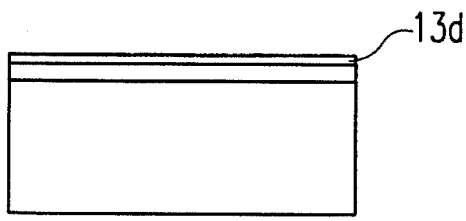
Figure 14D:
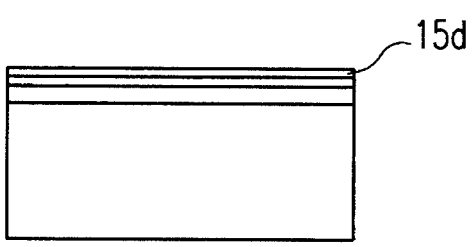
Figure 14E:
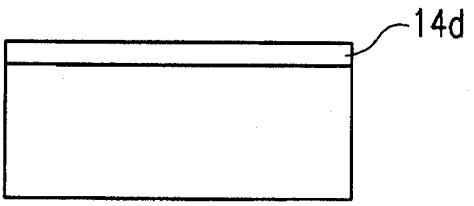
Figure 18:
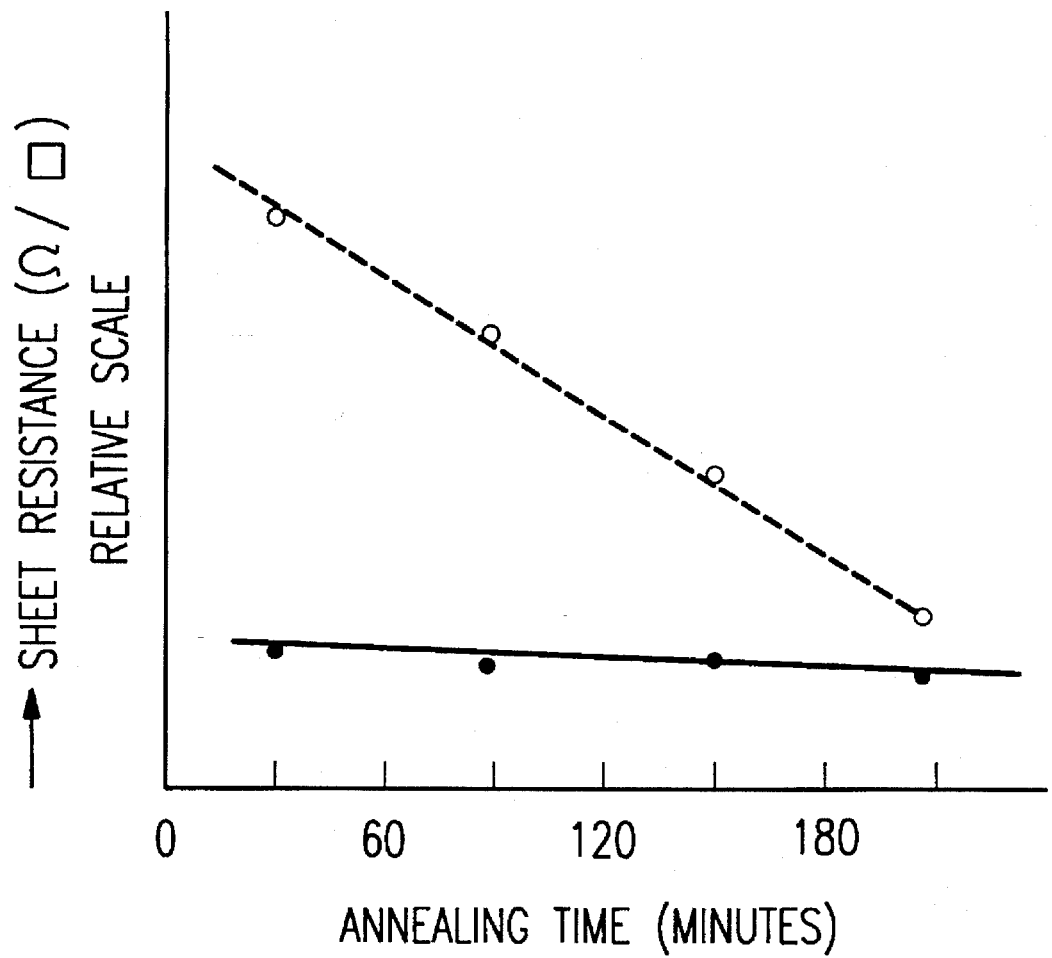
FIG. 18 is a characteristic diagram showing dependency of sheet resistance of boron-doped layer, on the annealing time interval for samples obtained, respectively, by the sequential steps of FIGS. 11(a)–11(d) and by the sequential steps of FIGS. 14(a)–14(e)

FIG. 18 is a graph showing the relation between the sheet resistance of the impurity-doped layers formed through the respective sequences of FIGS. 11(a)–11(d) and FIGS. 14(a)–14(e), and the annealing time in the respective steps of FIG. 11(d) and FIG. 14(e). In the FIG. 18 graph, the solid line shows the case where the FIGS. 14(a)–14(e) method is applied and the broken line shows the case where the FIGS. 11(a)–11(d) method is applied. In either case, the substrate temperature is set at 850° C. in the surface cleaning, and is otherwise set at 825° C. in other processing steps. All of the data shown in FIG. 18 are taken under the common condition that the film thickness of epitaxial growth layer is about 60 Å and the diborane charging pressure and charging time interval are, respectively, $1.3\times10^{-2}$ Pa and 100 seconds.

Figure 19A:
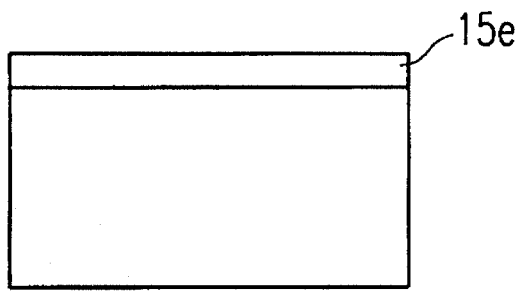
FIGS. 19(a)–19(c) are a step sequence sectional diagram showing a fifth embodiment of the invention for doping impurity.
Figure 19B:
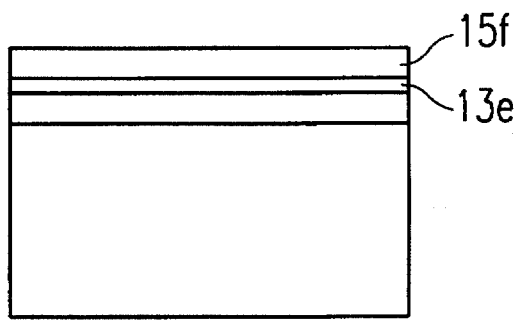
Figure 19C:
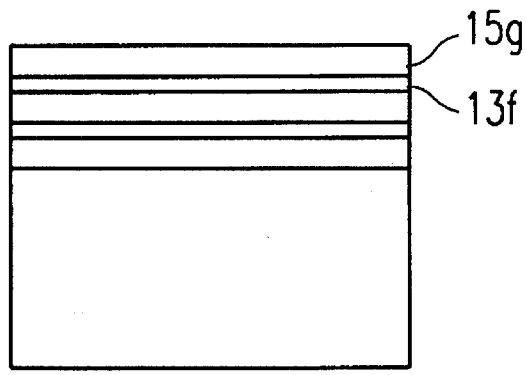

FIGS. 19(a)–19(c) are a step sequence diagram of a fifth embodiment of the invention where the method shown by the FIGS. 14(a)–14(e) are involved. In the step of FIG. 19(a), a first epitaxial growth layer 15e is formed on a surface of substrate 1. In the step of FIG. 19(b), a first impurity adsorption layer 13e and a second epitaxial growth layer 15f are successively formed. Further, in the step of FIG. 19(c), a second impurity adsorption layer 13f and a third epitaxial growth layer 15g are successively formed on the second epitaxial growth layer 15f. By such processing, there can be formed an alternate-layer structure having a desired number of layers composed of an impurity adsorption layer and an epitaxial growth layer. Further, if desired, annealing is carried out to form an impurity-doped region having a desired impurity density profile in the depth direction.

The several embodiments have been described hereinabove according to the invention. Lastly, as one of the significant features of the invention, selective doping will be described. As understood from the foregoing embodiments, the present invention is basically characterized in that a chemically active semiconductor surface is provided to form thereon an adsorption layer of the material containing at least one impurity element which forms a dopant in the semiconductor, and the impurity doping is effected into the semiconductor by using the adsorption layer as an impurity diffusion source. According to the detailed study of the inventors, it is found that an adsorption layer is not substantially formed on an insulation film or remains in the amount of at least one-order smaller on an insulating film as compared to the single crystal and polycrystal surface.

Figure 20A:
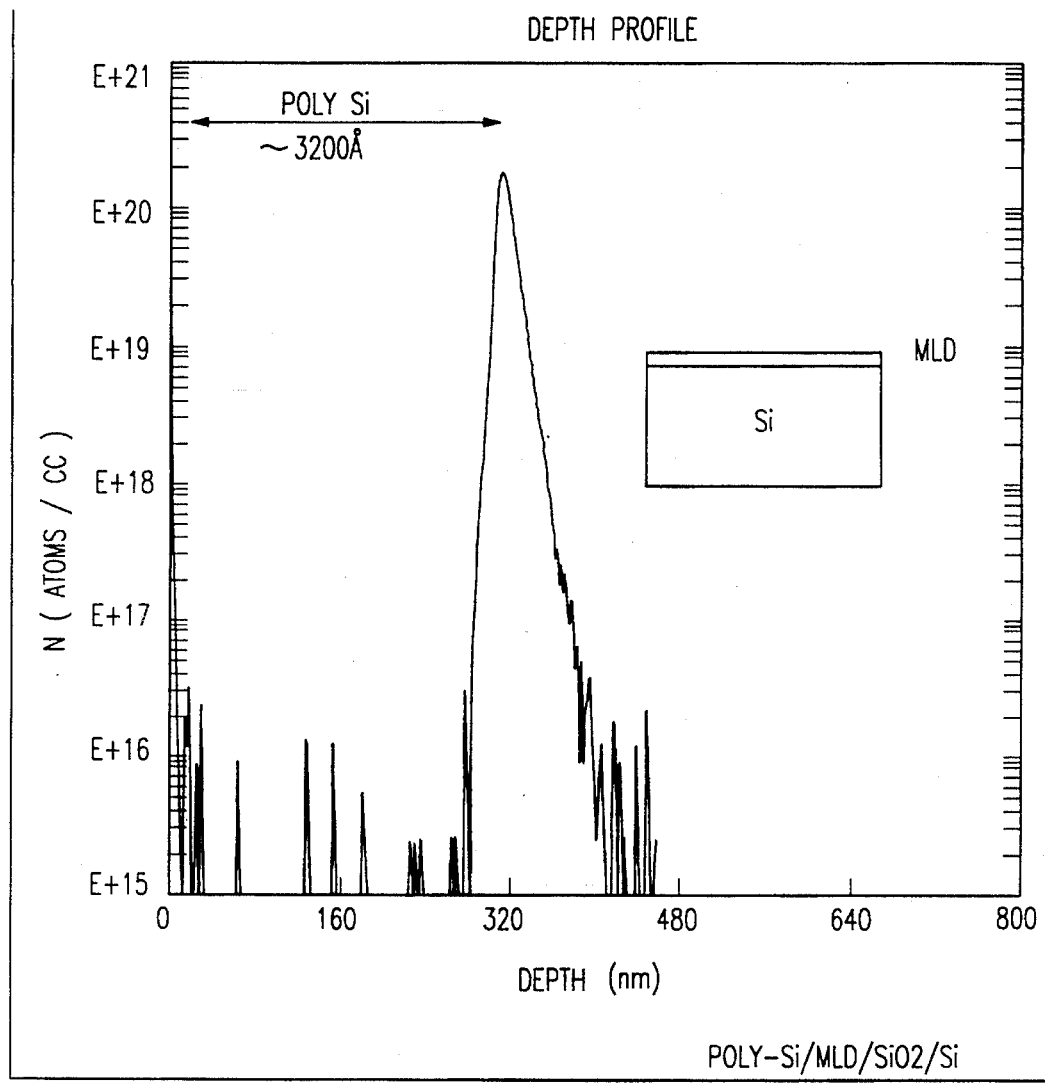
FIGS. 20(a) and 20(e) are boron density profiles of the depth direction for samples in which boron adsorption layers are formed on a single crystal silicon and on an oxide film, respectively.
Figure 20B:
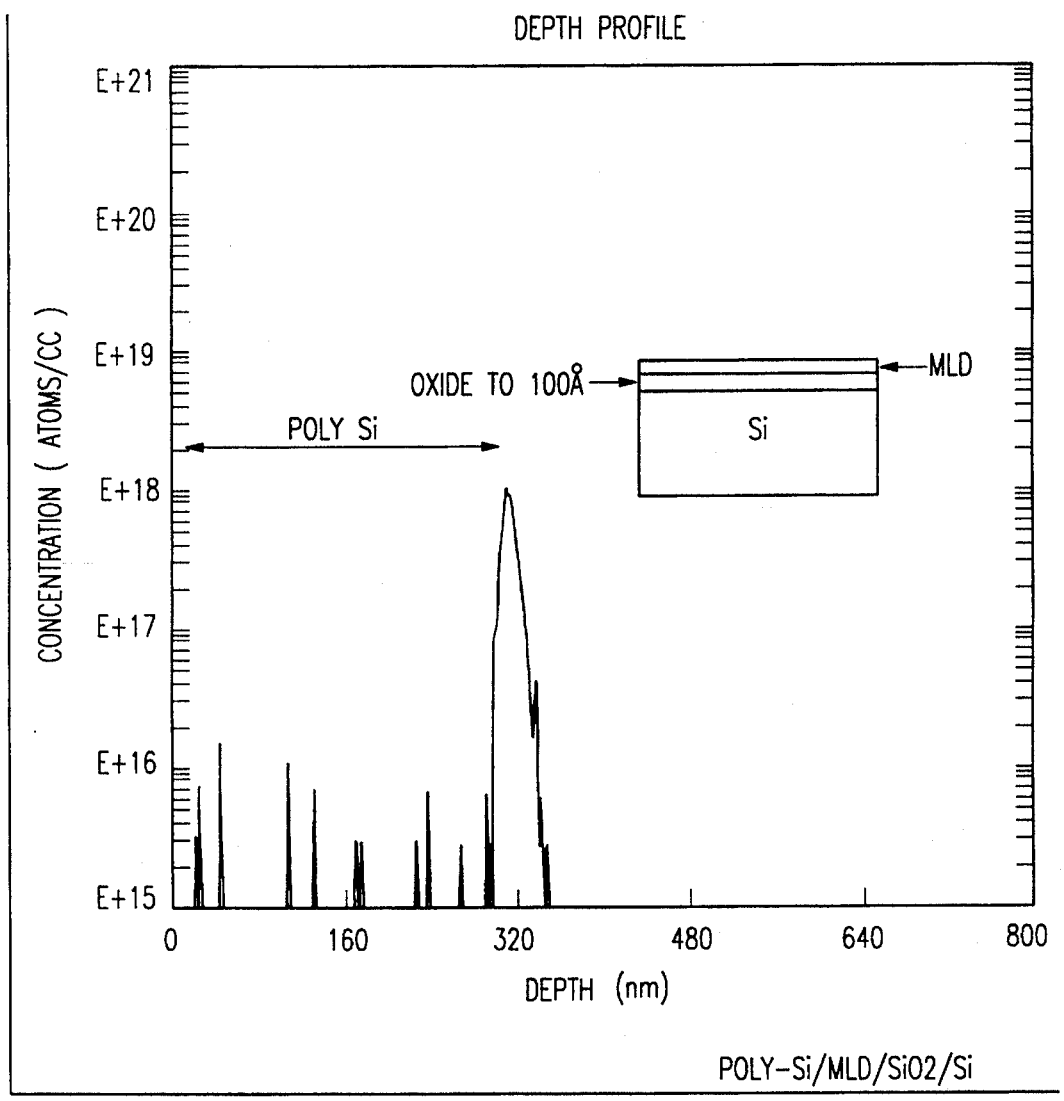

FIGS. 20(a) and 20(b) show boron density profiles measured in the depth direction by a secondary ion mass spectrometer for two different samples, respectively, i.e., a sample of N type silicon substrate having 5–7 Ωcm of resistivity and exposed single crystal surface and another sample of the same silicon substrate but formed on its surface with 100 Å thickness of silicon oxide film. The doping is effected for both of the samples in the FIG. 1 apparatus such that diborane is introduced at 800° C. of the substrate temperature with $1.9\times10^{-2}$ Pa of diborane charging pressure and 100 seconds of diborane charging interval to form an adsorption layer and thereafter about 3200 Å of polysilicon film is deposited by a regular CVD apparatus. In case of FIG. 20(a) where boron is adsorbed on the single crystal silicon substrate, peak boron density is about $2\times10^{20}$ atoms/cm$^3$ and total boron dose is about $3\times10^{14}$ atoms/cm$^2$ calculated from the profile. On the other hand, in case of FIG. 20(b) where boron is adsorbed on the silicon oxide film, the peak boron density is about $1\times10^{18}$ atoms/cm$^3$ and total boron dose is about $1\times10^{12}$ atoms/cm$^2$. Therefore, it is found in this case that boron amount adsorbed on the oxide film is less than 1% of that adsorbed on the single crystal face.

Figure 21:
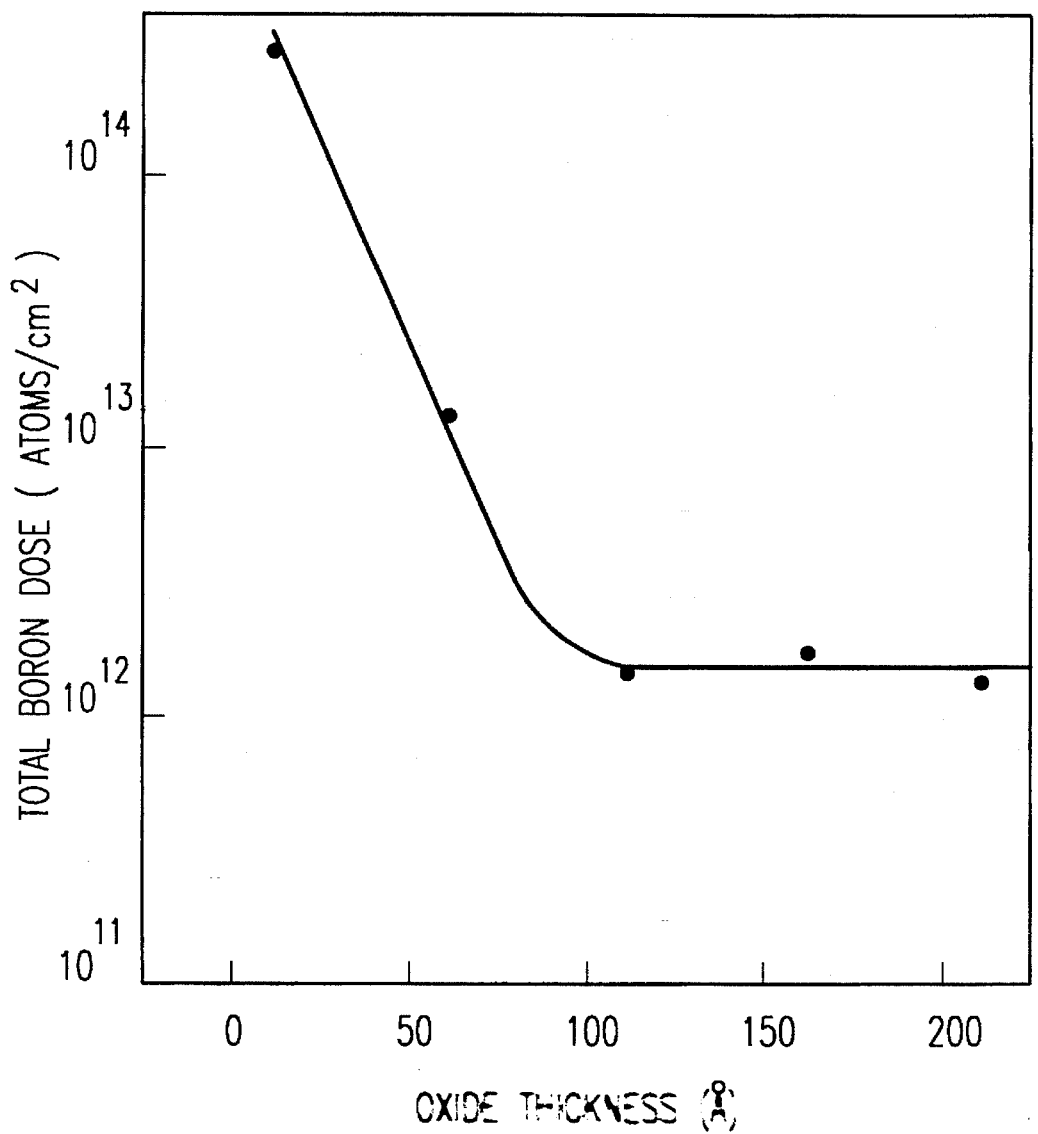
FIG. 21 is a characteristic diagram showing dependency of boron adsorption dose, on the thickness of oxide film in case that the boron adsorption layer is formed on the oxide film.
Figure 22A:
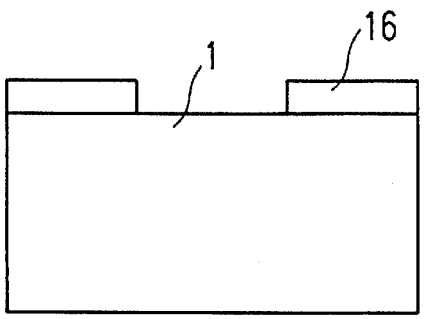
FIGS. 22(a)–22(d) are a step sequence sectional diagram showing an embodiment of selective doping.
Figure 22B:
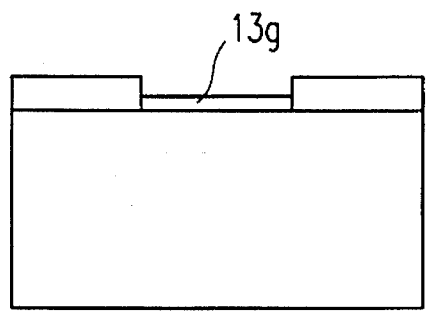
Figure 22C:
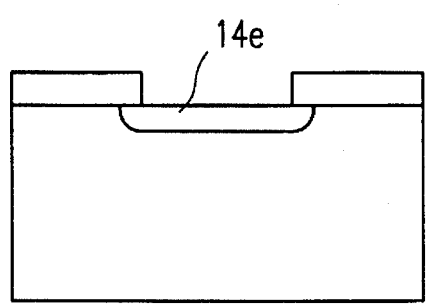
Figure 22D:
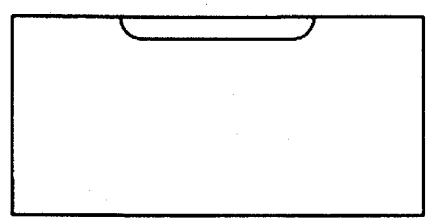
Figure 23:
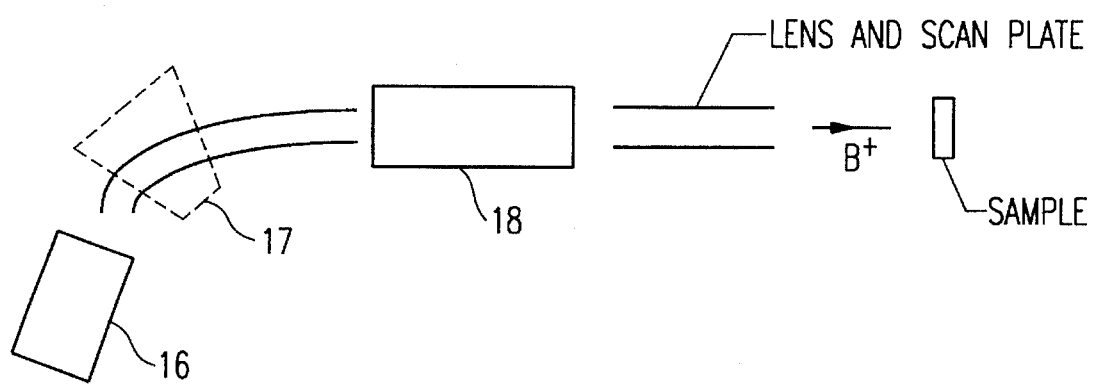
FIG. 23 is a schematic view of the conventional ion implantation apparatus.
Figure 24:
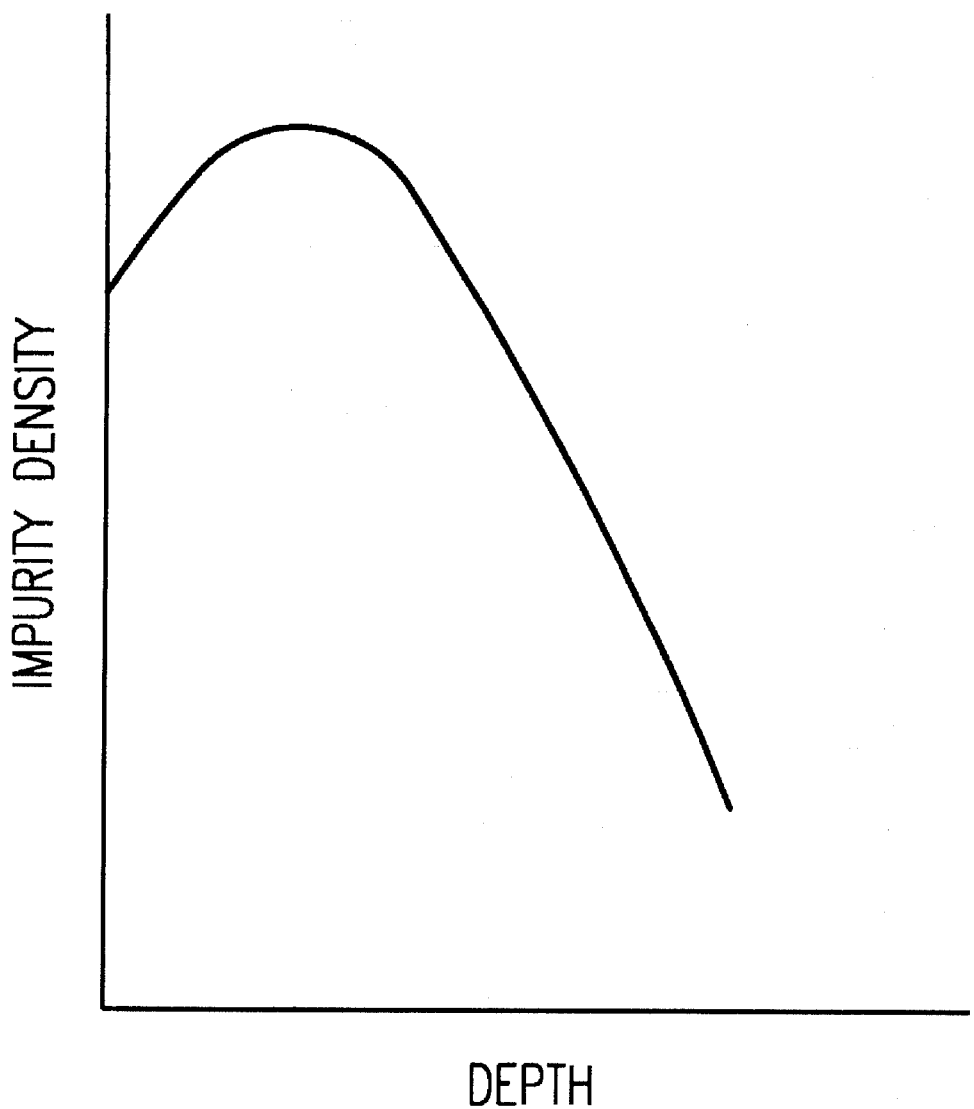
FIG. 24 is a typical impurity density profile of the depth direction, observed in the ion implantation method.

Further, FIG. 21 is a graph showing the dependency of the boron amount adsorbed on an oxide film on the thickness of the oxide film while the diborane charging condition is fixed for different oxide film thicknesses. The measurement or analysis is carried out in the same manner as in the FIG. 20(b) case. According to FIG. 21, when the substrate temperature is set to 800° C. during the charging of diborane, if the silicon oxide film has a thickness at least more than 100 Å, such silicon oxide can effectively function as a mask for the boron high density doping.

The above described feature is positively utilized to effect selective doping as shown in FIGS. 22(a)–22(d). In the FIG. 22(a) step, a surface of silicon substrate 1 is partly covered with a silicon oxide film 16, and thereafter, a silicon surface not covered by the oxide film 16 is activated. In the FIG. 22(b) step, a boron adsorption layer 13g is selectively formed only on the silicon face with using the oxide film 16 as a mask. Next in the FIG. 22(c) step, annealing is optionally effected to form an impurity-diffused layer 14e by using the adsorption layer 13g as a diffusion source to thereby carry out selective doping of boron into a region not covered by the oxide film. Further, in the FIG. 22(d) step, the oxide film 16 may be removed by etching if desired.

On the other hand, when removing boron adsorbed on the single crystal face or silicon oxide film, nitric acid solution can be used as etchant to etch away only boron adsorption layer with leaving the under-layer of silicon crystal or silicon oxide film.

Hereinabove, the various embodiments of the invention have been described in conjunction with FIGS. 1–22(d). In the above described embodiments, instead of diborane ($B_2H_6$), various III-group element compounds such as trimethyl gallium (TMG), trichloroboron ($BCl_3$) and decaborane ($B_{10}H_{14}$) can be effectively used as P type doping gas for silicon semiconductor. In similar manner, N type doping gas for silicon semiconductor can be selected from arsine ($AsH_3$), phosphorus trichloride ($PCl_3$), antimony pentachloride ($SbCl_5$), antimony hydride ($SbH_3$) and phosphine ($PH_3$). In the above described embodiments, the substrate temperature is set typically to 850° C. in the surface cleaning step, 825° C. in forming of the impurity adsorption layer, and 825° C. in epitaxial growing. It is confirmed by the inventors from the recent study that the invention is effectively practiced by properly setting conditions in the respective steps. Namely, the substrate temperature is preferably set in the range from 800° C. to 1200° C. in the surface cleaning treatment, dependently of background pressure and kinds of ambient gas. The substrate temperature can be set preferably in the range from 900° C. to 1100° C. for epitaxial growth process.

Moreover, natural oxide film can be removed by using HF gas treatment or Ar reverse sputtering method.

In addition, for example, diluted hydrofluoric acid treatment may be undertaken in order to suppress formation of a natural oxide film, thereby eliminating substantially the surface cleaning process.

As described above, according to the invention, there can be easily formed an impurity-doped region having high impurity density, consequently significantly small resistivity, and ultrashallow junction depth. Further in combination with epitaxial growth technology, there can be formed an impurity-doped region having a desired impurity density profile in the depth direction. Moreover, the present invention is based on adsorption which is quite different from the conventional ion implantation method, thereby eliminating damage, channeling and shadow effect which would be caused specifically by the ion implantation. Consequently, the present invention can achieve significant improvement in the fabrication technology of micro-semiconductor devices.

This application relates to subject matter disclosed in Japanese Application No. 1-194648, filed on Jul. 27, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A method for doping a region below a surface of a semiconductor substrate with an impurity comprising:

covering a portion of the substrate surface with an oxide insulating film having a thickness of at least 100 Å so that a part of the substrate surface is not covered by the insulating film and constitutes a diffusion area; and removing any inert film from the semiconductor surface diffusion area, by a procedure which includes at least one of a reduction reaction and a heat treatment, to expose a chemically active surface of the semiconductor; applying to the chemically active semiconductor surface a boron hydrogen gas compound containing boron impurity atoms and heating the substrate to a temperature between 600° C. and 950° C. to form chemically an adsorption layer in the form of a composite layer composed of an impurity layer containing the boron impurity atoms and a semiconductor layer; and effecting solid phase diffusion into the region using the adsorption layer as an impurity diffusion source and effecting activation of the impurity, wherein the substrate is maintained continuously in a vacuum after said step of removing and during said step of applying.

2. A method according to claim 1 wherein the substrate is of silicon and the impurity layer is formed substantially of boron.

3. A method according to claim 1 wherein the gas compound is diborane.

4. A method according to claim 1 wherein the semiconductor layer comprises silicon.

5. A method according to claim 4 wherein the impurity layer is formed by supplying diborane, and the silicon layer is formed by supplying dichlorosilane.

6. A method according to claim 1 wherein said step of effecting diffusion is carried out by lamp annealing or beam annealing.

7. A method as defined in claim 1 wherein said step of removing any inert film comprises establishing a background pressure of less than $10^{-4}$ Pa adjacent the semiconductor surface, and then bringing the semiconductor surface into contact with a hydrogen gas.

8. A method for doping a region below a surface of a semiconductor substrate with an impurity comprising:

covering a portion of the substrate surface except for the region with an oxide insulating film having a thickness of at least 100 Å to prevent an impurity adsorption layer from forming on the portion;

placing the semiconductor substrate in a vacuum chamber;

removing any inert film from the semiconductor surface diffusion area, by a procedure which includes at least one of a reduction reaction and a heat treatment in the vacuum chamber at a background pressure of less than $10^{-4}$ Pa to expose and keep a chemically active surface of the semiconductor;

applying to the chemically active semiconductor surface a boron hydrogen gas compound boron containing impurity atoms and heating the substrate in the vacuum chamber to form chemically the adsorption layer containing the boron impurity atoms; and effecting solid phase diffusion into the region using the adsorption layer as an impurity diffusion source and effecting activation of the impurity, wherein a silicon thin film is formed on the adsorption layer and solid phase diffusion is effected into the silicon thin film using the adsorption layer as an impurity diffusion source.

9. A method according to claim 8 wherein the gas compound is diborane.

* * * * *